United States Patent
Lee et al.

(10) Patent No.: US 8,913,547 B2
(45) Date of Patent: Dec. 16, 2014

(54) METHOD FOR PAIRING TERMINALS USING DUMMY DATA

(75) Inventors: Ji-Woong Lee, Gyeonggi-Do (KR);
Jin-Sook Ryu, Gyeonggi-Do (KR);
Yung-Mi Kim, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 654 days.

(21) Appl. No.: 13/254,139

(22) PCT Filed: Mar. 30, 2010

(86) PCT No.: PCT/KR2010/001941
§ 371 (c)(1),
(2), (4) Date: Aug. 31, 2011

(87) PCT Pub. No.: WO2010/114286
PCT Pub. Date: Oct. 7, 2010

(65) Prior Publication Data
US 2011/0312362 A1    Dec. 22, 2011

(30) Foreign Application Priority Data

Mar. 30, 2009  (KR) .................. 10-2009-0027060

(51) Int. Cl.
| | |
|---|---|
| H04W 36/20 | (2009.01) |
| H04W 72/04 | (2009.01) |
| H04W 72/02 | (2009.01) |
| H03D 1/00 | (2006.01) |
| H04J 3/00 | (2006.01) |
| H04W 72/00 | (2009.01) |

(52) U.S. Cl.
CPC ............... *H04W 72/005* (2013.01); *H03D 1/00* (2013.01); *H04W 72/02* (2013.01); *H04W 36/20* (2013.01); *H04W 72/04* (2013.01); *H04J 3/00* (2013.01)

USPC .......................................................... 370/318

(58) Field of Classification Search
CPC ............... H04L 2025/03426; H04L 25/03012; H04L 25/03834; H04L 27/20; H04L 1/0003; H04L 25/03821; H04W 72/082; H04W 52/16; H04W 72/0446; H04W 72/085; H04W 52/325; H04W 52/346; H04W 72/005; H04W 72/04; H04W 36/20; H04W 72/02; H03D 1/00; H04J 3/00
USPC ........................... 370/254–350; 709/201–213
See application file for complete search history.

(56) References Cited

U.S. PATENT DOCUMENTS

| | | | |
|---|---|---|---|
| 6,374,355 B1 | 4/2002 | Patel | |
| 2010/0203897 A1* | 8/2010 | Jamadagni et al. | 455/450 |
| 2010/0311410 A1* | 12/2010 | Lennartson et al. | 455/423 |

FOREIGN PATENT DOCUMENTS

| | | |
|---|---|---|
| KR | 10-1999-0080597 A | 11/1999 |
| WO | WO 2009-011513 A2 | 1/2009 |
| WO | WO 2009096832 A1 * | 8/2009 |

*Primary Examiner* — Phirin Sam
*Assistant Examiner* — Debebe Asefa
(74) *Attorney, Agent, or Firm* — Mckenna Long & Aldridge LLP

(57) ABSTRACT

Disclosed is a method for pairing terminals using a dummy terminal, the method including selecting at least one terminal from several, pairing a channel being used by the at least one terminal with data of a dummy terminal, receiving a measurement report message from the at least one terminal, adjusting power of the at least one terminal based upon the measurement report message, and pairing the at least one terminal with another terminal so as to use a channel being used by the at least one terminal together with the another terminal if the at least one terminal is suitable for pairing.

14 Claims, 6 Drawing Sheets

METHOD FOR PAIRING TERMINALS USING DUMMY DATA

This application is a 35 U.S.C. §371 National Stage entry of International Application No. PCT/KR2010/001941, filed on Mar. 30, 2010, and claims the benefit of priority of Korean Patent Application No. 10-2009-0027060, filed Mar. 30, 2009, each of which are hereby incorporated by reference in their entireties as if fully set forth herein.

TECHNICAL FIELD

The present invention relates to a method for pairing two terminals, and more particularly, a method for pairing two terminals using dummy data (or dummy terminal).

BACKGROUND ART

Second generation mobile communication refers to digital transmission and reception of voice (audio), and examples of the communication includes Code Division Multiple Access (CDMA), Global System for Mobile communications (GSM) and the like. General Packet Radio Service (GPRS) evolved from the GSM has been proposed. The GPRS is a technique for provisioning packet switched data services based upon the GSM system.

Third generation mobile communication refers to enabling transmission and reception of images (video) and data as well as voice (audio). Third Generation Partnership Project (3GPP) has developed International Mobile Telecommunication system (IMT-2000).

Various attempts have been made in the second and third generation mobile communications in order to more efficiently use an uplink from a terminal to a base station and a downlink from the base station to the terminal.

As one of the attempts, it has been proposed that audio data (i.e., data based upon circuit switching) generated by two terminals in the uplink and downlink are multiplexed into one radio resource for transmission and reception. For example, for Time Division Multiple Access (TDMA), audio data generated by two terminals are multiplexed into one time slot (Absolute Radio Frequency Channel Number (ARFCN) as a physical sub-channel and TDMA frame) so as to be transmitted and received.

As such, the technique for enabling transmission and reception by multiplexing audio data generated by two terminals into one time slot is referred to as Voice Services over Adaptive Multi-user Channels on One Slot (VAMOS). This technique also enables transmissions and receptions of video data, or general data generated by two terminals into one time slot.

Also, users who share the same physical resource may be called sub-channel users.

The VAMOS is implemented such that user's audio data is sent via a specific channel, for example, a traffic channel (TCH). Here, the specific channel may also be referred to as a multi-user channel. Examples of the TCH used for the VAMOS may include TCH/FS, TCH/HS, TCH/EFS, TCH/AFS, TCH/AHS, TCH/WFS and corresponding related control channels (e.g., FACCH and SACCH). Each of the TCH channels and each of the related control channels are combined in one pair using AQPSK (Adaptive Quadrature Phase Shift Keying) in downlink and GMSK in uplink, thus being mapped into one radio resource.

Hereinafter, description will be given of the related art with reference to FIGS. 1 to 3.

FIG. 1 is a block diagram illustrating modulation of sub-channels in the related art VAMOS.

Referring to FIG. 1, a sub-channel ai for first user's data, a sub-channel bi for second user's data and a control signal for power adjustment are mapped into quaternary symbols, at a transmitting end, i.e., a base station, and then undergo a pulse shaping after a symbol rotation.

That is, the data of the two sub-channels ai and bi are coded to be mapped to the AQPSK symbols.

FIG. 2 is a flowchart illustrating a method for pairing two terminals in the related art VAMOS, and FIG. 3 is an exemplary view of an application of the method shown in FIG. 2.

As shown in FIGS. 2 and 3, when transmission and reception of audio data are performed between several terminals and a base station (or a network entity), the base station (or a network entity) selects two appropriate terminals (S11).

The base station (or a network entity) then adjusts power of the selected two terminals (S12), thereby preparing a pairing operation. That is, the base station (or a network entity) adjusts power of the two terminals such that link qualities of the selected terminals can meet a target Signal to Noise Ratio (SNR).

If the link qualities of the selected terminals meet the target SNR, the base station (or a network entity) sends a pairing command to the two terminals (S13). Accordingly, as shown in FIG. 3(c), one of the terminals performs an intra-cell handover (or an inter-cell handover) so as to use a time slot which is being used by another terminal.

As mentioned above, for pairing two terminals, power of the two terminals should reach an appropriate level so as to satisfy a target SNR. However, there is a difficulty in maintaining Frame Error Rate (RER) and Co-channel interference between the two terminals at a satiable level while maintaining the powers of the two terminals at appropriate levels. Furthermore, since there is no way to recognize an accurate level of power suitable for satisfying both FER and the co-channel interference, this situation may have a very high possibility of call-drop occurring between the paired two terminals.

As such, there is such high possibility of the call-drop occurrence of the paired two terminals, especially, the call-drop problem is made worse in a fading environment. So, to prevent the call-drop, a margin of an appropriate power level should be set. However, another problem is raised because it cannot be known how high margin of the power level is to be set.

Also, in order to ensure link qualities after pairing, it should be determined how high level of initial power imbalance of the two terminals is to be set.

Meanwhile, to solve those problems, several approaches have been introduced, such as pairing terminals with high SNRs, increasing power prior to pairing, and the like. However, the link qualities after pairing cannot still be ensured, there still remains the call-drop occurrence in the fading environment.

In order to overcome the problem, the method shown in FIG. 4 has been proposed.

FIG. 4 is a flowchart illustrating another method for pairing two terminals in the related art VAMOS.

As shown in FIG. 4, when transmission and reception of audio data are performed between several terminals and a base station (or a network entity), the base station (or a network entity) selects two appropriate terminals (S21).

The base station adjusts powers of the selected two terminals (S22), thereby preparing a pairing operation. That is, the base station adjusts power of the two terminals such that link qualities of the selected terminals can meet a target SNR.

If the link qualities of the selected terminals meet the target SNR, the base station (or a network entity) sends a pairing command to the two terminals (S23). Accordingly, pairing is performed between the two terminals such that one of the two terminals can use a time slot which is being used by another terminal.

Here, the one terminal transmits and receives audio data by using both the paired time slot and a previously used time slot (S24). For example, if the first terminal having used the second time slot is paired with the second terminal to use the fourth time slot which is being used by the second terminal, the first terminal transmits and receives audio data by use of both the second and fourth time slots.

Afterwards, it is determined whether or not the link quality of the paired time slot is satiable (S25), and if not, the pairing is released (S26). However, if the link quality of the paired time slot is satisfactory, the resource of the previous time slot is released (S27), and audio data transmission and reception are continued by use of the paired time slot.

As described above, the another method according to the related art shown in FIG. 4 has been proposed to prevent the occurrence of call drop in the fading environment, but still has several problems as follows.

First, in order to maintain the previous time slot after the pairing, the base station (or a network entity) should be able to allocate multiple slots to one terminal. Also, in order to allocate multiple slots to one terminal, a control signal should be sent and received, resulting in disabling an efficient use of network resources.

In addition, the terminal has to use both the paired time slot and the previous time slot at the same time, which is difficult to be technically implemented. That is, the terminal within one frame should use several time slots, however, it cannot be easily implemented. In particular, if frequencies of the time slots are different, the terminal should perform frequency hopping for using several time slots, however, it is also very difficult to be implemented. Furthermore, if an interval between time slots is narrow, the terminal may not take sufficient time for the frequency hopping.

DISCLOSURE OF INVENTION

Technical Problem

Therefore, it is an object to overcome the aforesaid problems, namely, to provide an efficient pairing.

It is another object of the present invention to prevent occurrence of call drop after pairing.

Solution to Problem

To achieve those objects and other advantages of the present invention, there is provided a method for pairing terminals using dummy data (or a dummy terminal), the method including selecting at least one terminal from several terminals, pairing a channel being used by the at least one terminal with data of dummy data (or dummy terminal), receiving a measurement report message from the at least one terminal, adjusting power of the at least one terminal based upon the measurement report message, and pairing the at least one terminal with another terminal so as to use a channel being used by the at least one terminal together with the another terminal if the at least one terminal is suitable for pairing.

In accordance with another embodiment of the present invention, there is provided a method for pairing terminals using dummy data (or dummy terminal), the method including selecting a plurality of candidate terminals from several terminals, pairing channels being used by the plurality of candidate terminals with data of a dummy terminal, receiving a measurement report message from each of the plurality of candidate terminals, adjusting power of each candidate terminal based upon the measurement report message, determining whether a pair of terminals suitable for pairing are present among the candidate terminals, and pairing the determined pair of terminals with each other.

In accordance with another embodiment of the present invention, there is provided a method for pairing terminals, the method including selecting at least one first terminal among terminals, adding dummy data into a radio resource initially occupied by the selected first terminal, wherein the radio resource is orthogonally allocated into a first sub-channel and a second sub-channel, and wherein the first sub-channel is used for actual data of the at least one first terminal and the second sub-channel is used for the dummy data, receiving a measurement report message with respect to the first sub-channel from the at least one first terminal, pairing the at least one first terminal with at least one second terminal, if the same radio resource is suitable to be subsequently occupied by both the first and second terminals based on the received measurement report message, such that transmission of actual data to the first terminal on the first sub-channel and transmission of actual data to the second terminal on the second sub-channel are performed using the same radio resource.

The method may further include determining whether the same radio resource is suitable to be subsequently occupied by both the first terminal and a second terminal based on the received measurement report message.

In the determining step, the same radio resource may be determined to be subsequently occupied by both the terminals, if the measurement report message indicates that the first sub-channel satisfies a predetermined SNR value.

In the determining step, the same radio resource may be determined to be subsequently occupied by both the terminals, if the measurement report message indicates that the first sub-channel has a state that the first terminal successfully receives the actual data on the first sub-channel.

The method may further include stopping adding the dummy data into the same radio resource according to the determining step.

The method may further include transmitting, to the first terminal, an indication indicating that the dummy data is added to the radio resource.

The method may further include operating, by the first terminal, an advanced receiver if the first terminal receives the indicator.

The method may further include operating, by the first terminal, a normal receiver until the first terminal receives the indicator.

Each of the first sub-channel and the second sub-channel may correspond to a Voice Services over Adaptive Multi-user Channels on One Slot (VAMOS).

The radio resource may correspond to ARFCN of a time slot in a TDMA frame.

The method may further include controlling a parameter for the first sub-channel based on the measurement report message.

The parameter may be a transmission power and the controlling of the parameter may be performed such that the transmission power gradually decreases or increases.

The dummy data may be modulated to be mapped with Q channel in Quaternary Modulation technique.

The method may further include transmitting to the second terminal, an intra-cell handover command or an inter-cell handover command.

The method may further include releasing a second radio resource initially occupied by the second terminal after transmitting the intra-cell handover command or the inter-cell handover command.

The radio resource may be allocated by a training sequence code.

Advantageous Effects of Invention

According to the present invention, the base station (or a network entity) sends data of the dummy terminal by modulating the same with Q channel in Quaternary Modulation, accordingly, the terminal may not demodulate the data of the dummy terminal. Therefore, even if at least one terminal does not support VAMOS, namely, is the related art terminal without supporting VAMOS, the base station (or a network entity) can check whether or not a time slot being used by the at least one terminal is suitable to be used together with another terminal by performing pairing between the terminals.

Also, according to the present invention, since the pairing is first performed between a selected terminal and a dummy terminal, followed by a determination as to whether a time slot being used by the selected terminal is suitable to be used together with another terminal is made by pairing the two terminals, drastic lowering of link quality after an actual pairing can be prevented.

In addition, according to the present invention, since the pairing is first performed between the selected terminal and the dummy terminal, followed by a determination as to whether a time slot being used by the selected terminal is suitable to be used together with another terminal is made by pairing the two terminals, the call drop problem which may occur in the related art due to an actual pairing between two terminals can be overcome.

Furthermore, since the selected terminal does not demodulate data of the dummy terminal, information or operation added to the selected terminal may not be needed.

MODE FOR THE INVENTION

Figure 1:
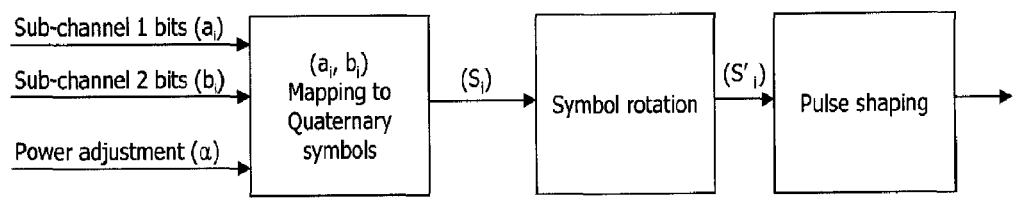
FIG. 1 is a block diagram illustrating modulation of subchannels in the related art VAMOS.
Figure 2:
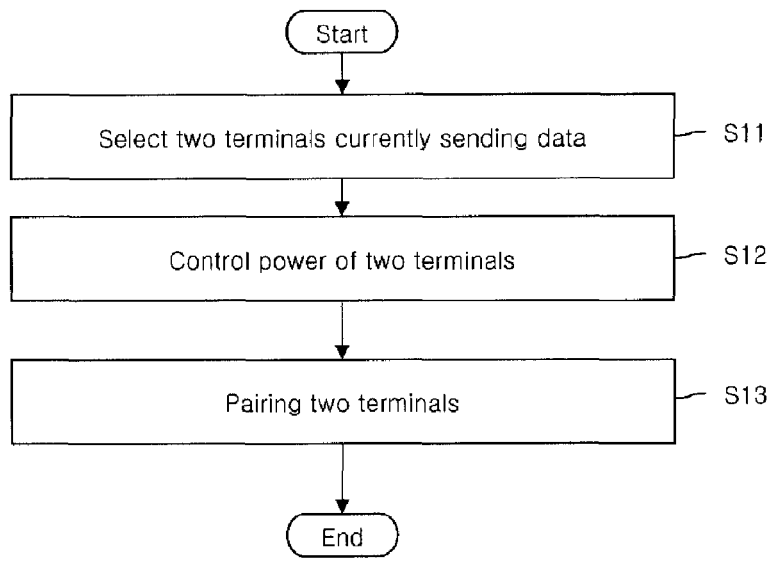
FIG. 2 is a flowchart illustrating a method for pairing two terminals in the related VAMOS.
Figure 3:
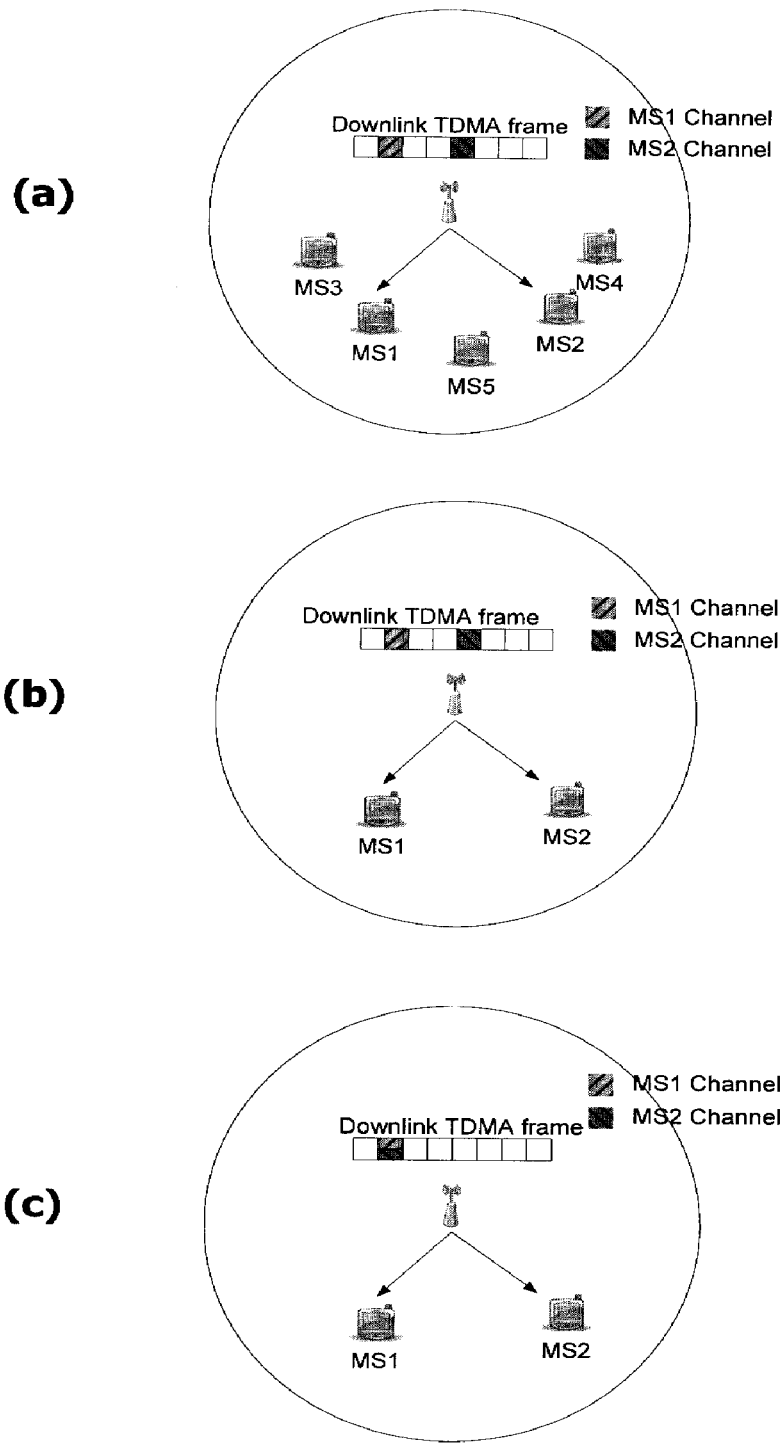
FIG. 3 is an exemplary view of an application of the method shown in FIG. 2.
Figure 4:
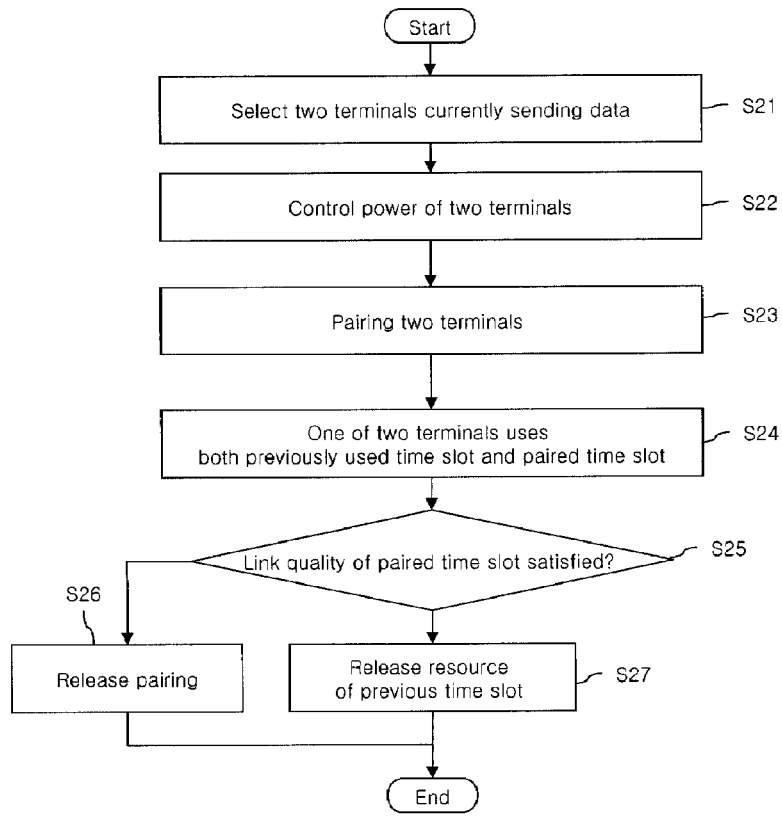
FIG. 4 is a flowchart illustrating another method for pairing two terminals in the related art VAMOS.

The present invention is applied to a communication system using TDMA. However, the present invention may not be limited to the TDMA, but applicable to any communication systems complying with a technical scope of the present invention.

Technical terms used in this specification are used to merely illustrate specific embodiments, and should be understood that they are not intended to limit the present invention. As far as not being defined differently, all terms used herein including technical or scientific terms may have the same meaning as those generally understood by an ordinary person skilled in the art to which the present invention belongs to, and should not be construed in an excessively comprehensive meaning or an excessively restricted meaning. In addition, if a technical term used in the description of the present invention is an erroneous term that fails to clearly express the idea of the present invention, it should be replaced by a technical term that can be properly understood by the skilled person in the art. In addition, general term used in the description of the present invention should be construed according to definitions in dictionaries or according to its front or rear context, and should not be construed to have an excessively restrained meaning.

A singular representation may include a plural representation as far as it represents a definitely different meaning from the context. Terms 'include' or 'has' used herein should be understood that they are intended to indicate an existence of several components or several steps, disclosed in the specification, and it may also be understood that part of the components or steps may not be included or additional components or steps may further be included.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

It will be understood that when an element is referred to as being "connected with" another element, the element can be directly connected with the other element or intervening elements may also be present. In contrast, when an element is referred to as being "directly connected with" another element, there are no intervening elements present.

Embodiments of the present invention will be described below in detail with reference to the accompanying drawings, where those components are rendered the same reference number that are the same or are in correspondence, regardless of the figure number, and redundant explanations are omitted. In describing the present invention, if a detailed explanation for a related known function or construction is considered to unnecessarily divert the gist of the present invention, such explanation has been omitted but would be understood by those skilled in the art. The accompanying drawings are used to help easily understood the technical idea of the present invention and it should be understood that the idea of the present invention is not limited by the accompanying drawings. The idea of the present invention should be construed to extend to any alterations, equivalents and substitutes besides the accompanying drawings.

Hereinafter, a terminal is illustrated, and the terminal may be also called user equipment (UE), mobile equipment (ME), or mobile station (MS). In addition, the terminal may be a mobile device having a communication function such as mobile phones, personal digital assistants (PDAs), smart phones, laptop computers, and the like, or may be a device that cannot be carried around such as personal computers (PCs) or a vehicle-mounted device.

Figure 5:
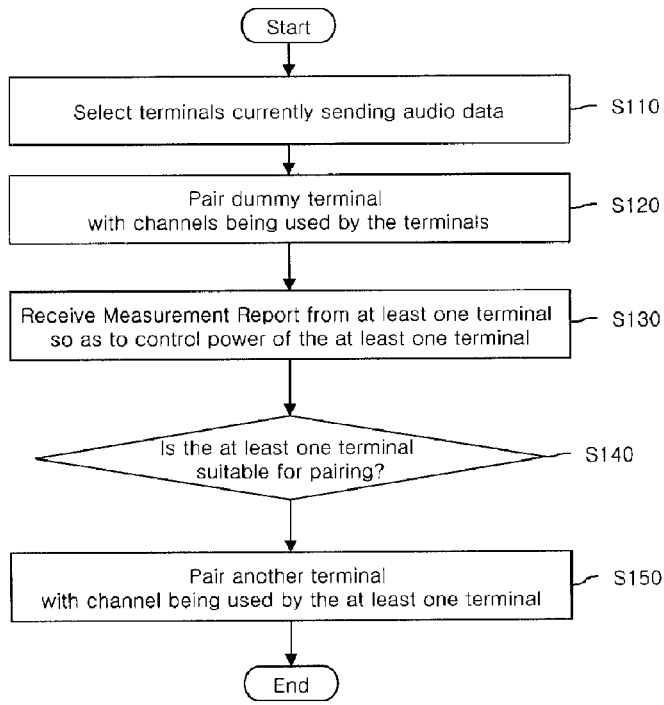
FIG. 5 is a flowchart illustrating a pairing method in accordance with a first embodiment of the present invention.
Figure 6:
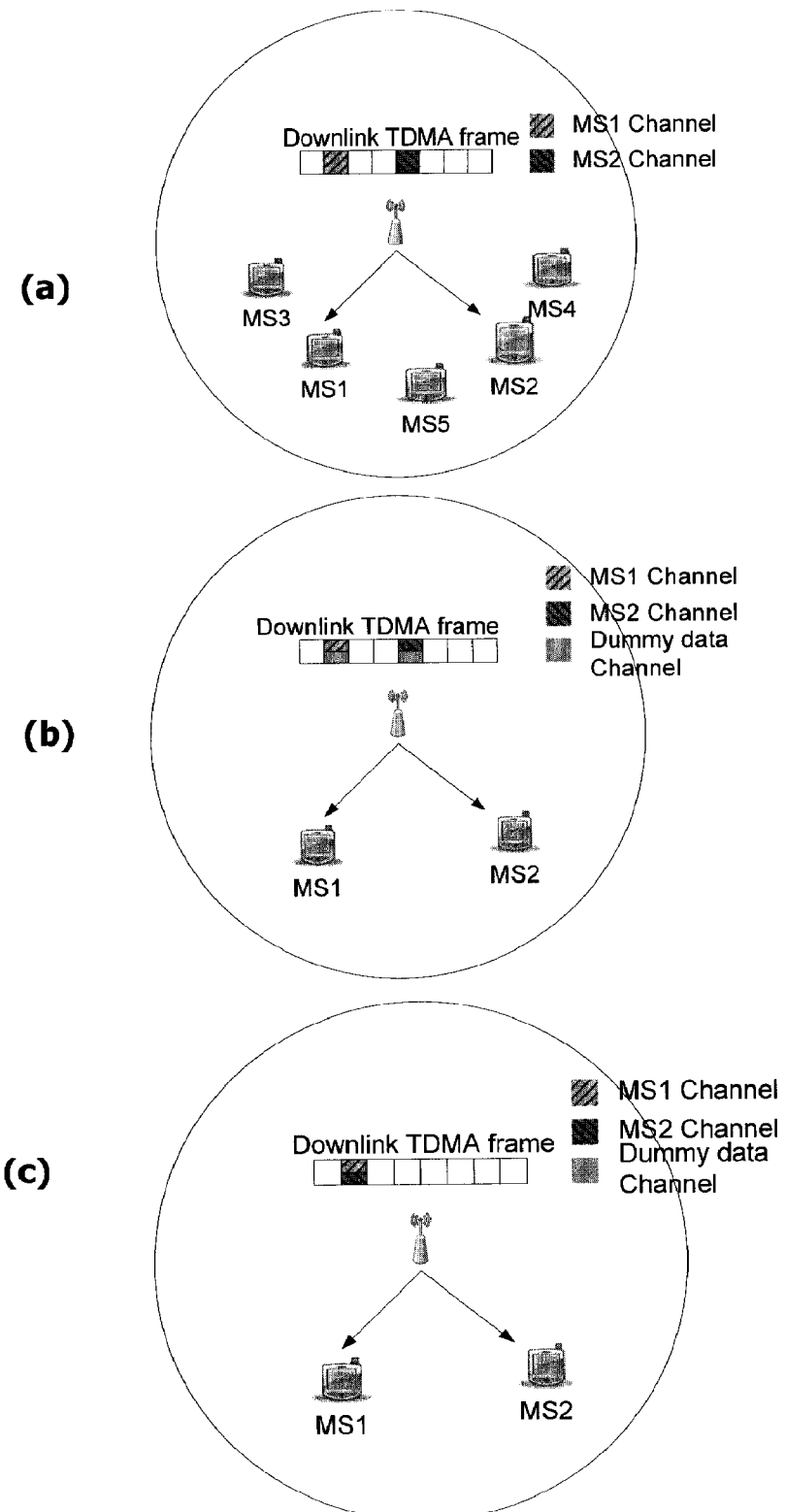
FIG. 6 is an exemplary view of an application of the first embodiment of the present invention.

FIG. 5 is a flowchart illustrating a pairing method in accordance with a first embodiment of the present invention, and FIG. 6 is an exemplary view of an application of the first embodiment of the present invention.

As shown in FIGS. 5 and 6(*a*), at least two or more terminals to be paired are selected from several terminals which are sending data (for example audio data) within coverage of a base station (S110). Here, at least one of the selected pair of terminals is a terminal which supports VAMOS.

Referring to FIG. 6(*b*), the base station adds a dummy data (i.e., multimedia data such as audio data, video data, or text data) (or general data) (which is generated by a dummy terminal) into at least one time slot which is being used by one of the selected two terminals, thereafter sending real data (i.e., multimedia data such as audio data, video data, or text data) (or general data) and the dummy data on the time slot to the terminals (S120). Here, the dummy data has the same format as it of the real data. And, the dummy data is a same kind (i.e., audio data, or video data) of the real data. Also, the time slot may be a traffic channel (TCH) time slot. To this end, the base station (or a network entity) performs a channel mode switching of the time slots. That is, the base station (or a network entity) switches a single user TCH mode in which each time slot is used by a single user into a multiuser mode (e.g., VAMOS mode) in which a time slot is used by several users. Here, the base station (or a network entity) renders power of the dummy terminal decreased so as to avoid lowering of link qualities of the time slots which are being used by the terminals.

Here, since the terminal does not demodulate the dummy data (of the dummy terminal) within the time slot, the dummy data acts as noise. That is, the base station (or a network entity) modulates the dummy data with Q channel in Quaternary modulation for transmission. Accordingly, the terminal does not have to demodulate the dummy data. Therefore, even if at least one of the pair of terminals does not support VAMOS, that is, is the related art terminal without supporting VAMOS, the base station (or a network entity) may check whether or not a time slot which is being used by the at least one terminal is suitable to be used together with another terminal by pairing the two terminals.

In the meantime, each of the terminals measures power with respect to its own data within the time slot as compared to noise, and reports the measurement result to the base station (or a network entity) via a measurement report message. That is, each of the terminals measures its power and reports the measurement result to the base station (or a network entity) in order to avoid a call drop problem from occurring due to noise by the dummy terminal.

Upon receiving the measurement report message (e.g., Measurement Report), the base station (or a network entity) adjusts power of the at least one terminal (S130). That is, the base station adjusts the power of the terminal such that the link quality of the selected terminal can meet a target SNR value.

If the terminals are suitable for pairing, namely, the link qualities of the selected pair of terminals meet the target SNR value (S140), the base station (or a network entity) sends a pairing command (or intra-cell handover command) to both the terminals, so as to pair at least one terminal with another terminal such that a channel (or a radio resource or a time slot) being used by the at least one terminal is useable together with the another terminal (S150). Accordingly, as shown in FIG. 6(*c*), one terminal performs an intra-cell handover (or intra-cell handover) so as to use a time slot which is being used by the another terminal.

Although each data of the two terminals is allocated to one radio resource, the two data may be identified from each other. Such identification may be possible by virtue of a training sequence. Thus, the two data are orthogonal to each other.

That is, one training sequence of a specific set of training sequences is allocated into a sub-channel for each user on the related control channel and the multi-user channel.

As described above, in accordance with the first embodiment of the present invention, since the base station (or a network entity) modulates the dummy data (of the dummy terminal) with Q channel in Quaternary modulation for transmission, the terminal may not demodulate the dummy data (of the dummy terminal). Therefore, even if at least one of the pair of terminals does not support VAMOS, that is, is the related art terminal without supporting VAMOS, the base station (or a network entity) may check whether or not a time slot which is being used by the at least one terminal is suitable to be used together with another terminal by pairing the two terminals.

In accordance with the first embodiment of the present invention, the pairing is first performed between a selected terminal and a dummy terminal, followed by a determination as to whether or not a time slot which is being used by the selected terminal is suitable to be used together with another terminal by pairing the two terminals, thereby preventing drastic lowering of link quality after an actual pairing.

In accordance with the first embodiment of the present invention, the pairing is first performed between a selected terminal and a dummy terminal, followed by a determination as to whether or not a time slot which is being used by the selected terminal is suitable to be used together with another terminal by pairing the two terminals, accordingly, a call drop problem which may occur due to an actual pairing of two terminals as in the related art has been overcome.

In accordance with the first embodiment of the present invention, since the selected terminal does not demodulate the data of the dummy terminal, information or operation added to the selected terminal is not needed.

Figure 7:
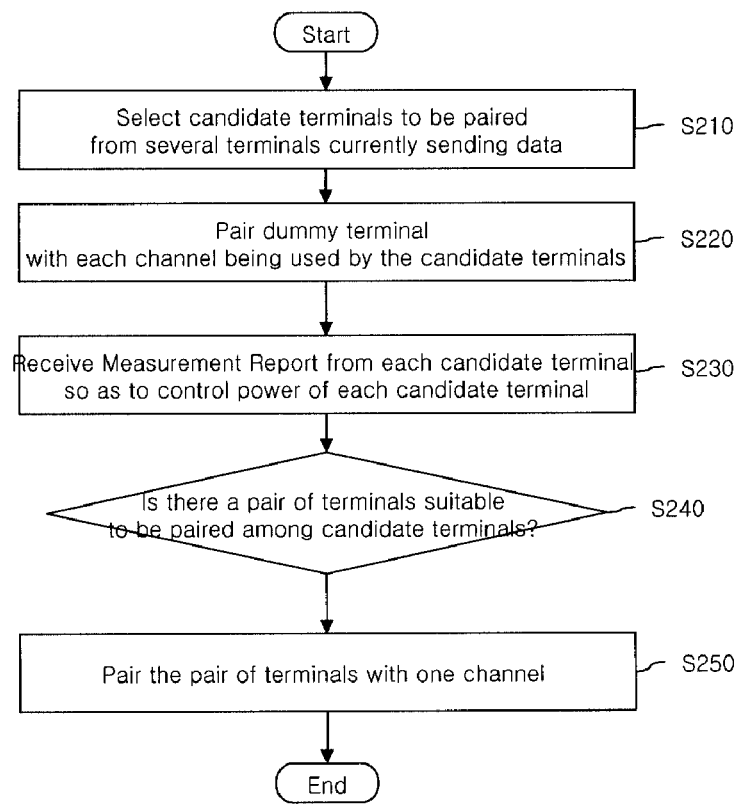
FIG. 7 is a flowchart illustrating another pairing method in accordance with a second embodiment of the present invention.
Figure 8:
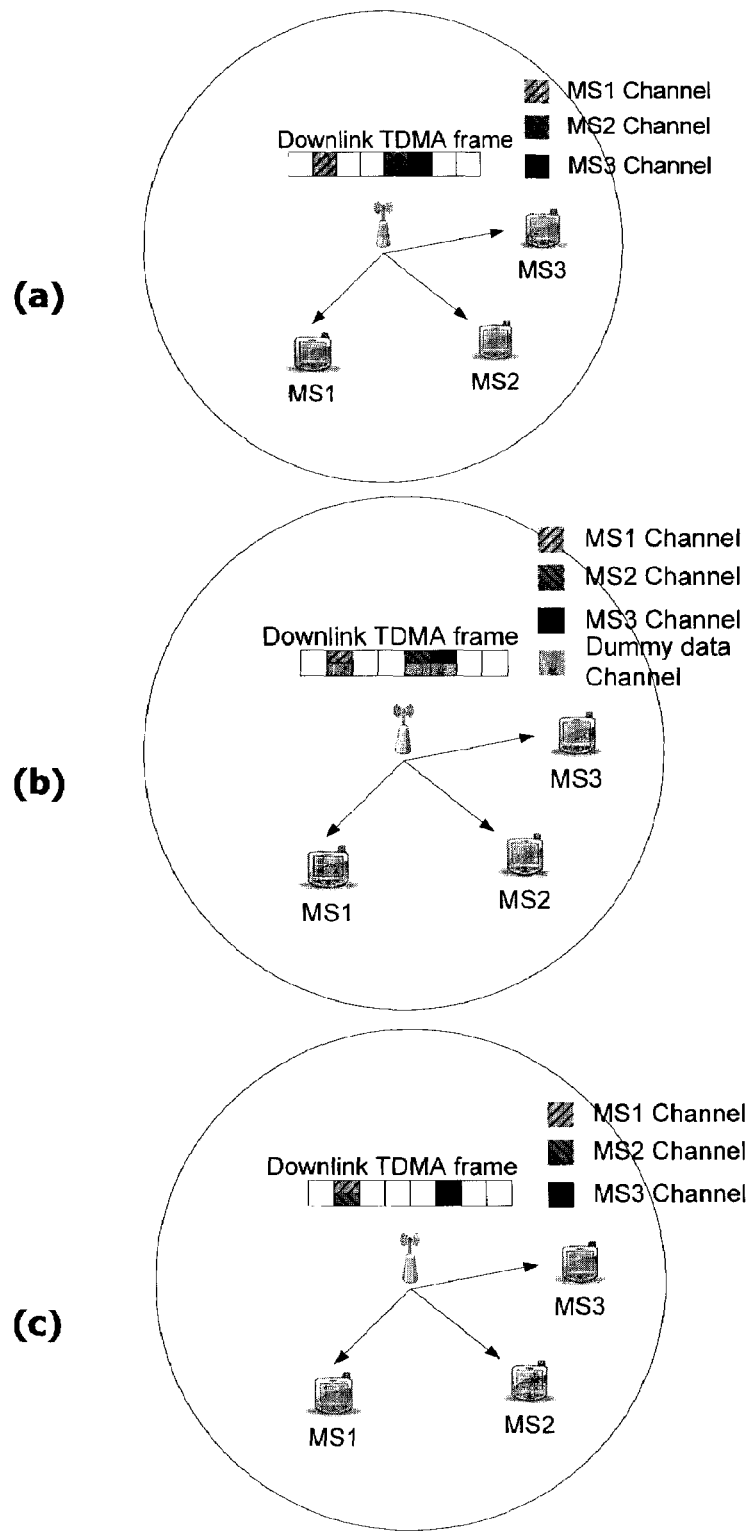
FIG. 8 is an exemplary view of an application of the second embodiment of the present invention.

FIG. 7 is a flowchart illustrating another pairing method in accordance with a second embodiment of the present invention, and FIG. 8 is an exemplary view of an application of the second embodiment of the present invention.

Referring to FIGS. 7 and 8, candidate terminals to be paired are selected from several terminals which are sending data (for example audio data) within coverage of a base station (S120).

Referring to FIG. 8(*b*), the base station (or a network entity) adds dummy data (which is generated by a dummy terminal) into time slots which are being used by the selected candidate terminals, thereafter sending both real data and the dummy data on the time slot to the candidate terminals (S220). Here, the base station (or a network entity) renders power of the dummy data decreased so as to avoid lowering of link qualities of the time slots which are being used by the terminals.

Here, since the terminals do not demodulate the dummy data within the time slots, the dummy data acts as noise with respect to the candidate terminals.

In the meantime, each of the candidate terminals measures power with respect to its own data within the time slot as compared to noise, and each reports the measurement result to the base station (or a network entity) via a measurement report message. That is, each of the candidate terminals measures its own power and reports the measurement result to the base station (or a network entity) in order to avoid a call drop problem from occurring due to noise by the dummy terminal.

The base station (or a network entity) adjusts power of each candidate terminal based upon the measurement report message (e.g., Measurement Report) (S230). That is, the base station (or a network entity) controls the power of the candidate terminals such that the link qualities of the selected terminals meet a target SNR value.

The base station (or a network entity) determines whether or not terminals suitable for pairing are present among the candidate terminals, namely, determines whether or not link qualities meet a target SNR value (S240). If the terminals appropriate for pairing are present, the base station (or a network entity) sends a pairing command (or intra-cell handover command) to the terminals, so as to pair terminals such that a terminal can use a channel which is being used by the other terminal (S250). Accordingly, as shown in FIG. 8(c), the at least one terminal performs an intra-cell handover (or intra-cell handover) so as to be allowed the use of the time slot which is being used by the another terminal.

As described above, in accordance with a second embodiment of the present invention, after first selecting candidate terminals to be paired, the selected candidate terminals are paired with a dummy terminal and then a determination as to whether pairing is suitable is performed, thereby preventing drastic lowering of link qualities after an actual pairing and also avoiding occurrence of a call drop problem after the actual pairing.

Meanwhile, the method according to the present invention, as described so far, can be implemented by hardware or software, or any combination thereof. For example, the method according to the present invention may be stored in a storage medium (e.g., an internal memory of a mobile terminal, a flash memory, a hard disc, etc.). Alternatively, the method according to the present invention can be implemented as codes or command words within a software program capable of being executed by a processor (e.g., a microprocessor in a mobile terminal).

The present invention has been explained with reference to the embodiments which are merely exemplary. It will be apparent to those skilled in the art that various modifications and equivalent other embodiments can be made in the present invention without departing from the spirit or scope of the invention. Also, it will be understood that the present invention can be implemented by selectively combining the aforementioned embodiment(s) entirely or partially. Thus, it is intended that the present invention cover modifications and variations of this invention provided they come within the scope of the appended claims and their equivalents.

The invention claimed is:

1. A method for pairing terminals, comprising:
   selecting a first terminal to be paired with a second terminal;
   pairing the first terminal with a dummy terminal by adding dummy data for the dummy terminal into a radio resource initially occupied by the first terminal,
   wherein the power of the dummy terminal is adjusted so that it is less than the power of the first terminal, and
   wherein the dummy data is modulated by a quaternary modulation scheme and the dummy data is not de-modulated by the first terminal;
   wherein the radio resource is orthogonally allocated into a first sub-channel and a second sub-channel, and wherein the first sub-channel is used for actual data of the first terminal and the second sub-channel is used for the dummy terminal;
   receiving a measurement report message with respect to the first sub-channel from the first terminal;
   pairing the first terminal with the second terminal instead of the dummy terminal, if the same radio resource is suitable to be subsequently occupied by both the first and second terminals based on the received measurement report message.

2. The method of claim 1, further comprising:
   determining whether the same radio resource is suitable to be subsequently occupied by both the first terminal and the second terminal based on the received measurement report message.

3. The method of claim 2, wherein in the determining step the same radio resource is determined to be subsequently occupied by both the first terminal and the second terminal, if the measurement report message indicates that the first sub-channel satisfies a predetermined SNR value.

4. The method of claim 2, wherein in the determining step the same radio resource is determined to be subsequently occupied by both the terminals first terminal and the second terminal, if the measurement report message indicates that the first sub-channel has a state that the first terminal successfully receives the actual data on the first sub-channel.

5. The method of claim 2, further comprising:
   stopping adding the dummy data into the same radio resource according to the determining step.

6. The method of claim 1, further comprising:
   transmitting, to the first terminal, an indication indicating that the dummy data is added to the radio resource.

7. The method of claim 1, wherein each of the first sub-channel and the second sub-channel corresponds to a Voice Services over Adaptive Multi-user Channels on One Slot (VAMOS).

8. The method of claim 1, wherein the radio resource corresponds to ARFCN of a time slot in a TDMA frame.

9. The method of claim 1, further comprising:
   controlling a parameter for the first sub-channel based on the measurement report message.

10. The method of claim 9, wherein the parameter is a transmission power and the controlling of the parameter is performed such that the transmission power gradually decreases or increases.

11. The method of claim 1, wherein the dummy data is modulated to be mapped with Q channel in Quaternary Modulation technique.

12. The method of claim 1, further comprising:
    transmitting to the second terminal, an intra-cell handover command.

13. The method of claim 12, further comprising:
    releasing a second radio resource initially occupied by the second terminal after transmitting the intra-cell handover command.

14. The method of claim 1, wherein the radio resource is allocated by a training sequence code.

* * * * *